US011054112B2

(12) United States Patent
Shimizu et al.

(10) Patent No.: US 11,054,112 B2
(45) Date of Patent: Jul. 6, 2021

(54) CERAMIC PHOSPHOR WITH LATERAL LIGHT BARRIERS

(71) Applicant: Lumileds LLC, San Jose, CA (US)

(72) Inventors: Kentaro Shimizu, Sunnyvale, CA (US); Venkata Ananth Tamma, San Jose, CA (US); Hisashi Masui, California, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/228,586

(22) Filed: Dec. 20, 2018

(65) Prior Publication Data

US 2019/0195466 A1    Jun. 27, 2019

Related U.S. Application Data

(63) Continuation-in-part of application No. 16/226,487, filed on Dec. 19, 2019.

(60) Provisional application No. 62/609,588, filed on Dec. 22, 2017.

(51) Int. Cl.
| | |
|---|---|
| *F21V 9/30* | (2018.01) |
| *H01L 33/50* | (2010.01) |
| *H01L 25/075* | (2006.01) |
| *F21Y 115/10* | (2016.01) |

(52) U.S. Cl.
CPC ............ *F21V 9/30* (2018.02); *H01L 25/0753* (2013.01); *H01L 33/505* (2013.01); *H01L 33/508* (2013.01); *F21Y 2115/10* (2016.08)

(58) Field of Classification Search
CPC ... H01L 33/505; H01L 33/508; H01L 25/075; H01L 25/0753; F21V 9/30–38
See application file for complete search history.

(56) References Cited

U.S. PATENT DOCUMENTS

| | | | |
|---|---|---|---|
| 5,867,238 A | 2/1999 | Miller et al. | |
| 9,117,776 B2 | 8/2015 | Kim et al. | |
| 9,159,890 B2 | 10/2015 | Moosburger et al. | |
| 9,431,635 B2 | 8/2016 | Heuser et al. | |
| 9,508,908 B2 | 11/2016 | Vampola et al. | |
| 9,799,805 B2 * | 10/2017 | Brandl | H01L 27/15 |
| 9,857,049 B2 | 1/2018 | Chung et al. | |
| 9,891,350 B2 | 2/2018 | Lofftus et al. | |
| 2008/0187746 A1 | 8/2008 | De Graaf et al. | |
| 2009/0212697 A1 | 8/2009 | Nakamura et al. | |
| 2011/0233575 A1 * | 9/2011 | Huang | H01L 27/153 257/89 |

(Continued)

FOREIGN PATENT DOCUMENTS

| | | |
|---|---|---|
| CN | 103548157 A | 1/2014 |
| CN | 106019688 | 10/2016 |

(Continued)

OTHER PUBLICATIONS

English translation of Office Action corresponding to TW application No. 107146679, dated Jul. 23, 2019, 9 pages.

(Continued)

*Primary Examiner* — Mariceli Santiago

(57) ABSTRACT

A device including a phosphor layer having a plurality of air gaps arranged within the phosphor layer to block lateral light transmission. The phosphor layer can be sized and positioned to be continuously extend over a plurality of LED emitter pixels.

14 Claims, 15 Drawing Sheets

(56) References Cited

U.S. PATENT DOCUMENTS

| | | |
|---|---|---|
| 2012/0141771 A1 | 6/2012 | Pan et al. |
| 2012/0193657 A1* | 8/2012 | von Malm ............ H01L 27/153 257/89 |
| 2013/0258637 A1* | 10/2013 | Wang .................... H01L 33/505 362/84 |
| 2014/0098556 A1 | 4/2014 | Von Malm et al. |
| 2014/0306258 A1* | 10/2014 | Liepold ................ H01L 33/505 257/98 |
| 2014/0339582 A1* | 11/2014 | Matsumura ........... H01L 33/505 257/98 |
| 2015/0055319 A1* | 2/2015 | Zink ........................ F21V 9/08 362/84 |
| 2015/0207045 A1* | 7/2015 | Wada .................... H01L 33/505 257/88 |
| 2017/0012026 A1 | 1/2017 | Choi |
| 2017/0207373 A1 | 7/2017 | Gootz et al. |
| 2019/0041701 A1* | 2/2019 | Chen .................. H01L 25/0753 |

FOREIGN PATENT DOCUMENTS

| | | |
|---|---|---|
| CN | 106707595 | 5/2017 |
| GB | 2433640 | 6/2007 |
| JP | 2004-239935 | 8/2004 |
| KR | 20140003455 A | 1/2014 |
| KR | 20150069364 | 6/2015 |
| TW | 201235447 A | 9/2012 |
| WO | 2012/156121 A1 | 11/2012 |
| WO | 2016/190855 A1 | 12/2016 |
| WO | 2017/014926 A1 | 1/2017 |
| WO | 2017/104313 | 6/2017 |
| WO | 2017/134589 | 8/2017 |
| WO | 2017/222298 | 12/2017 |

OTHER PUBLICATIONS

International Search Report corresponding to PCT/US2018/067151, dated Mar. 22, 2019, 1 page.

* cited by examiner

CERAMIC PHOSPHOR WITH LATERAL LIGHT BARRIERS

CROSS REFERENCE TO RELATED APPLICATIONS

This application claims the benefit of U.S. Provisional Application No. 62/609,588 filed Dec. 22, 2017 and U.S. Non-Provisional application Ser. No. 16/226,487 filed Dec. 19, 2018, which are incorporated by reference as if fully set forth.

FIELD OF THE INVENTION

The present invention relates to light emitting diodes (LEDs), and more particularly, to ceramic phosphors with lateral light barriers.

BACKGROUND

Manufacturing small addressable LED pixel systems with lateral light barriers can be difficult. Coating phosphor sidewalls with absorbers, distributed Bragg reflectors (DBR), or other optical isolating material can provide a partial solution but may be impossible or costly to implement on segmented LED systems with pixels sized on the order of 500 microns or smaller.

Currently, light crosstalk between emitter segments is commonly controlled by use of sidewall reflectors and absorbers to isolate each LED segment. However, for very small pixel size LEDs, such as those less than 500 microns or even 300 micron LEDs, phosphor segments are closely spaced, and sidewall coating application of absorbers, DBR, or other optical isolating material is difficult.

SUMMARY

In one embodiment a device can include a phosphor layer comprising phosphor material and at least one of a ceramic, a glass, or an organic binder. A plurality of air gaps can be arranged within specific regions, areas, or internal walls of the phosphor layer to block light transmission.

In another embodiment an LED package includes a phosphor layer comprising phosphor material and at least one of a ceramic, a glass, or an organic binder, and having a plurality of air gaps arranged within to reduce lateral light transmission through the phosphor layer. A light emitting diode (LED) array can be attached to the phosphor layer, with each LED in the array including an emitter pixel. The phosphor layer can be sized and positioned to continuously extend over a plurality of LED emitter pixels.

In some embodiments the phosphor layer comprises layered thin films. In other embodiments at least some of the plurality of air gaps define continuous walls around a region tin the phosphor layer that block outgoing or incoming lateral light transmission.

The light emitting diode (LED) array can define interpixel lanes and at least some of the plurality of air gaps in the phosphor layer are positioned to vertically extend over the interpixel lanes.

In some embodiments the plurality of air gaps further include at least one of continuous, discontinuous, partial open channels, and etched pinholes in the phosphor layer. The air gaps can also be arranged to define two-dimensional patterned lateral light barriers that are at least one of radial, linear, rectangular, square, or hexagonal. In some embodiments the plurality of air gaps define two-dimensional patterned lateral light barriers that extend from bottom to top of phosphor layer.

In another embodiment, a method of making a ceramic phosphor layer includes the steps of combining ceramic powder precursors, a ceramic binder, phosphor material, and solvent to form a mixture. The mixture is coated onto a substrate to form a film. Conditions for creating air gap formation in selected regions of coated mixture are arranged by at least one of deforming or removing material from the film, or adding at least one of sacrificial material, sintering rods, and beads to the film. The film can be heated to form a ceramic phosphor with air gaps in selected regions.

In another embodiment, a method for making a ceramic phosphor layer with lateral light barriers includes the steps of mixing ceramic powder precursors, the ceramic binder, solvent, and polymeric beads or rods; slotting die coating onto a substrate to form a thin film; and layering multipole sheets to from thicker layers. Rods and beads or other sacrificial material can be sintered to create air pockets and the phosphor ceramic finished by cutting or polishing the layers.

DETAILED DESCRIPTION

Figure 1A:
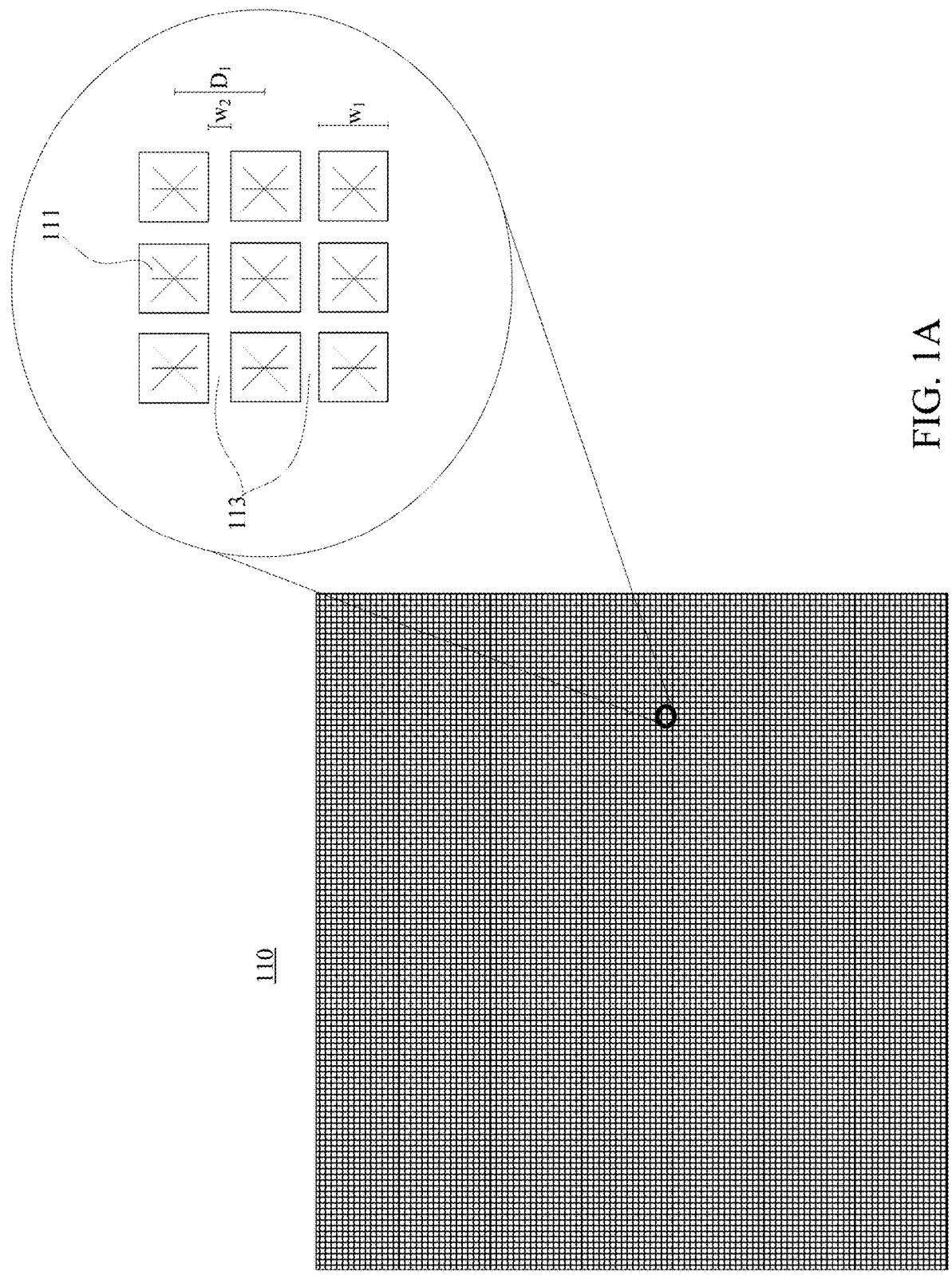
FIG. 1A is a top view illustration of an LED array with an exploded portion.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

Methods and structures for creating lateral light barriers within ceramic phosphor system such as described below can be used in conjunction with, or as a replacement for or improvement of, sidewall or inter-segment lane reflectors and absorbers.

Figure 1B:
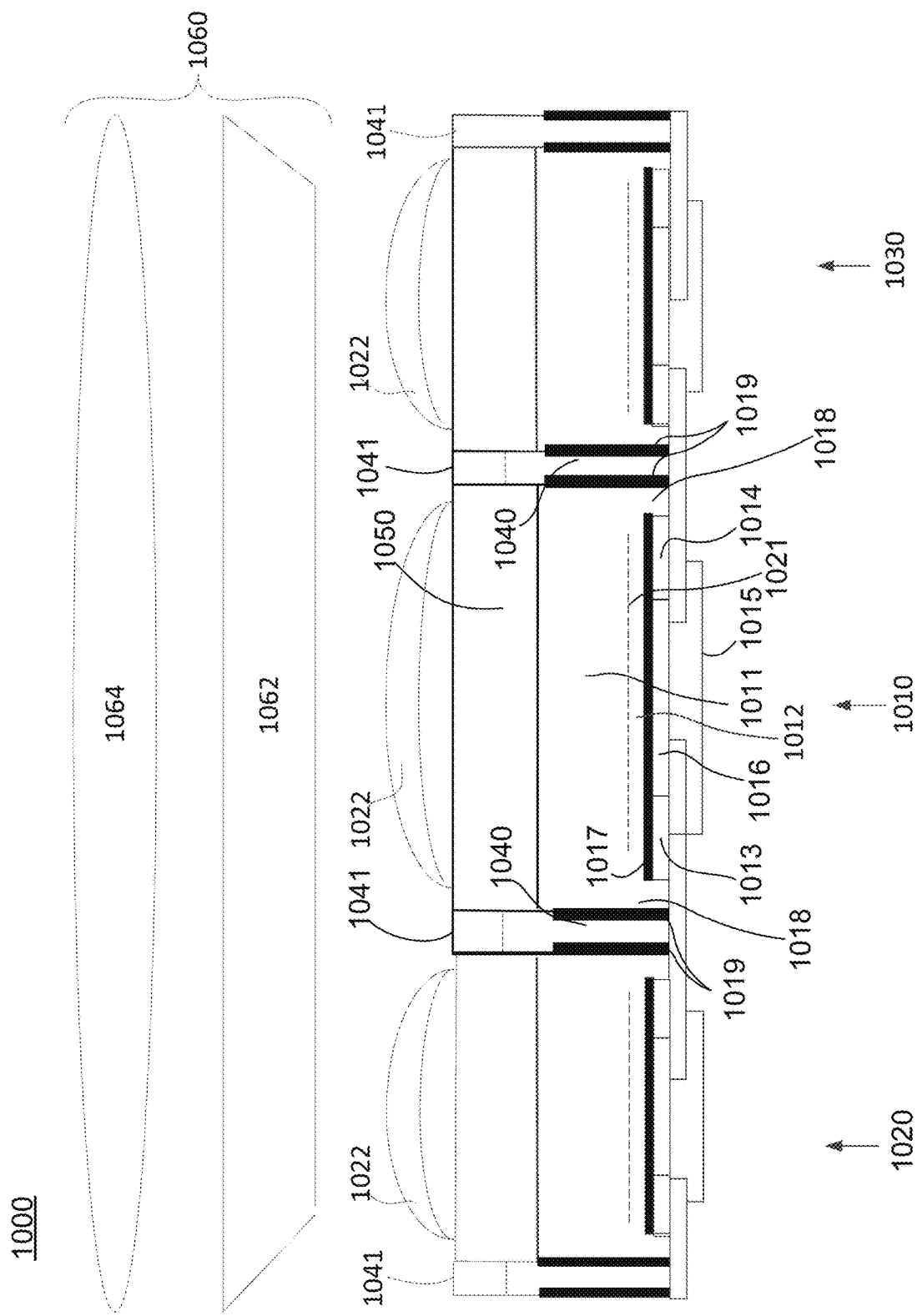
FIG. 1B is a cross sectional illustration of an LED array with trenches.
Figure 1C:
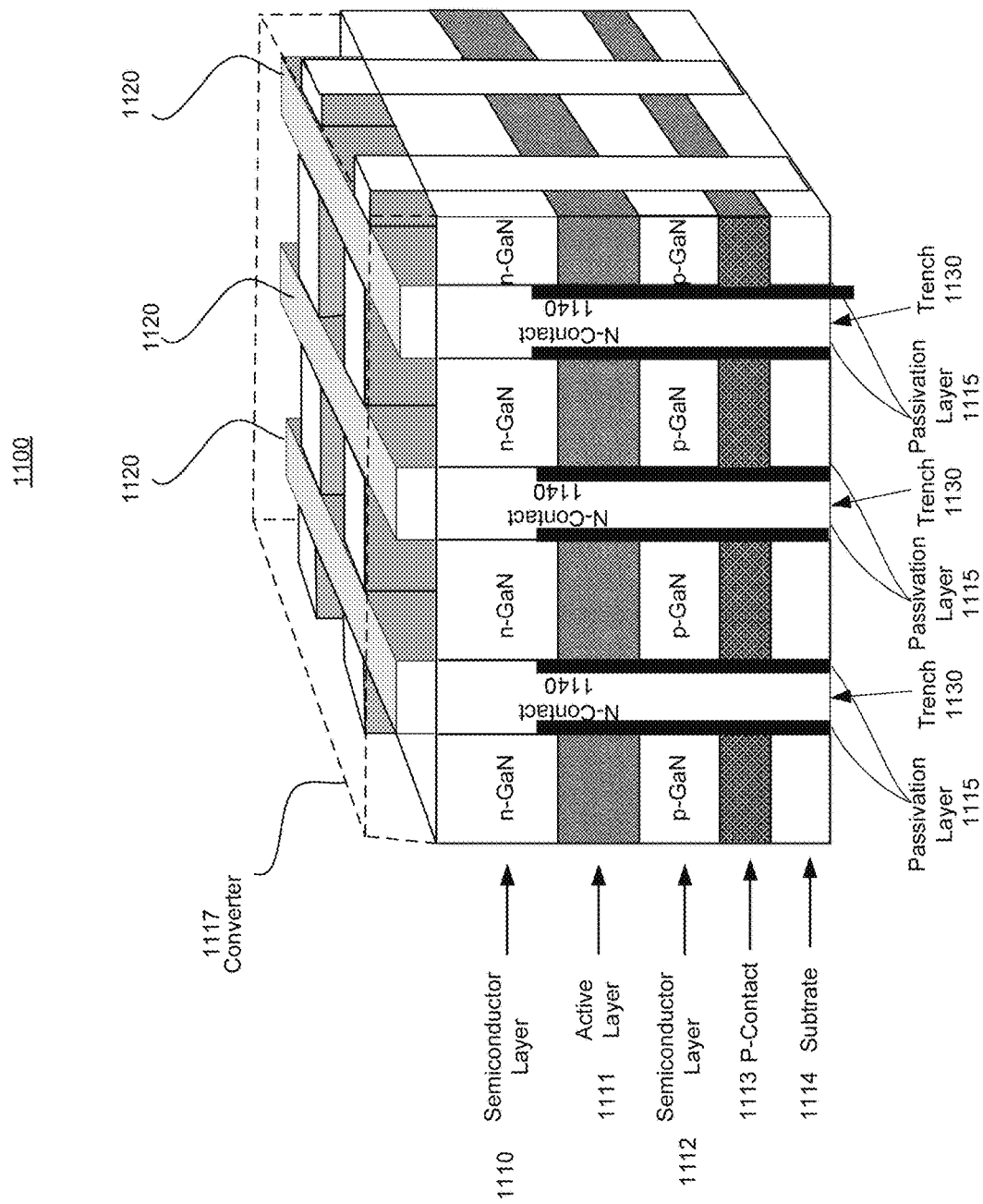
FIG. 1C is a perspective illustration of another LED array with trenches.

According to embodiments of the disclosed subject matter, LED arrays (e.g., micro LED arrays) may include an array of pixels as shown in FIGS. 1A, 1B, and/or 1C. LED arrays may be used for any applications such as those requiring precision control of LED array segments. Pixels in an LED array may be individually addressable, may be addressable in groups/subsets, or may not be addressable. In FIG. 1A, a top view of a LED array 110 with pixels 111 is shown. An exploded view of a 3×3 portion of the LED array 110 is also shown in FIG. 1A. As shown in the 3×3 portion exploded view, LED array 110 may include pixels 111 with a width $w_1$ of approximately 100 µm or less (e.g., 40 µm). The lanes 113 between the pixels may be separated by a width, $w_2$, of approximately 20 µm or less (e.g., 5 µm). The lanes 113 may provide an air gap between pixels or may contain other material, as shown in FIGS. 1B and 1C and further disclosed herein. The distance di from the center of one pixel 111 to the center of an adjacent pixel 111 may be approximately 120 µm or less (e.g., 45 µm). It will be understood that the widths and distances provided herein are examples only, and that actual widths and/or dimensions may vary.

It will be understood that although rectangular pixels arranged in a symmetric matrix are shown in FIGS. 1A, B and C, pixels of any shape and arrangement may be applied to the embodiments disclosed herein. For example, LED array 110 of FIG. 1A may include, over 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

FIG. 1B shows a cross section view of an example LED array 1000. As shown, the pixels 1010, 1020, and 1030 correspond to three different pixels within an LED array such that a separation sections 1041 and/or n-type contacts 1040 separate the pixels from each other. According to an embodiment, the space between pixels may be occupied by an air gap. As shown, pixel 1010 includes an epitaxial layer 1011 which may be grown on any applicable substrate such as, for example, a sapphire substrate, which may be removed from the epitaxial layer 1011. A surface of the growth layer distal from contact 1015 may be substantially planar or may be patterned. A p-type region 1012 may be located in proximity to a p-contact 1017. An active region 1021 may be disposed adjacent to the n-type region and a p-type region 1012. Alternatively, the active region 1021 may be between a semiconductor layer or n-type region and p-type region 1012 and may receive a current such that the active region 1021 emits light beams. The p-contact 1017 may be in contact with SiO2 layers 1013 and 1014 as well as plated metal (e.g., plated copper) layer 1016. The n type contacts 1040 may include an applicable metal such as Cu. The metal layer 1016 may be in contact with a reflective layer 1015 which may serve as a contact.

Notably, as shown in FIG. 1B, the n-type contact 1040 may be deposited into trenches 1130 created between pixels 1010, 1020, and 1030 and may extend beyond the epitaxial layer. Separation sections 1041 may separate all (as shown) or part of a converter material 1050. It will be understood that a LED array may be implemented without such separation sections 1041 or the separation sections 1041 may correspond to an air gap. The separation sections 1041 may be an extension of the n-type contacts 1040, such that, separation sections 1041 are formed from the same material as the n-type contacts 1040 (e.g., copper). Alternatively, the separation sections 1041 may be formed from a material different than the n-type contacts 1040. According to an embodiment, separation sections 1041 may include reflective material. The material in separation sections 1041 and/or the n-type contact 1040 may be deposited in any applicable manner such as, for example, by applying a mesh structure which includes or allows the deposition of the n-type contact 1040 and/or separation sections 1041. Converter material 1050 may have features/properties similar to wavelength converting layer 205 of FIG. 2A. As noted herein, one or more additional layers may coat the separation sections 1041. Such a layer may be a reflective layer, a scattering layer, an absorptive layer, or any other applicable layer. One or more passivation layers 1019 may fully or partially separate the n-contact 1040 from the epitaxial layer 1011.

The epitaxial layer 1011 may be formed from any applicable material to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors may have indices of refraction ranging from about 2.4 to about 4.1 at the typical emission wavelengths of LEDs in which they are present. For example, III-Nitride semiconductors, such as GaN, may have refractive indices of about 2.4 at 500 nm, and III-Phosphide semiconductors, such as InGaP, may have refractive indices of about 3.7 at 600 nm. Contacts coupled to the LED device 200 may be formed from a solder, such as AuSn, AuGa, AuSi or SAC solders.

The n-type region may be grown on a growth substrate and may include one or more layers of semiconductor material that include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Similarly, the p-type region 1012 may include multiple layers of different composition, thickness, and dopant concentrations, including layers that are not intentionally doped, or n-type layers. An electrical current may be caused to flow through the p-n junction (e.g., via contacts) and the pixels may generate light of a first wavelength determined at least in part by the bandgap energy of the materials. A pixel may directly emit light (e.g., regular or direct emission LED) or may emit light into a wavelength converting layer 1050 (e.g., phosphor converted LED, "PCLED", etc.) that acts to further modify wavelength of the emitted light to output a light of a second wavelength.

Although FIG. 1B shows an example LED array 1000 with pixels 1010, 1020, and 1030 in an example arrangement, it will be understood that pixels in an LED array may be provided in any one of a number of arrangements. For example, the pixels may be in a flip chip structure, a vertical injection thin film (VTF) structure, a multi-junction structure, a thin film flip chip (TFFC), lateral devices, etc. For example, a lateral LED pixel may be similar to a flip chip LED pixel but may not be flipped upside down for direct connection of the electrodes to a substrate or package. A TFFC may also be similar to a flip chip LED pixel but may have the growth substrate removed (leaving the thin film semiconductor layers un-supported). In contrast, the growth substrate or other substrate may be included as part of a flip chip LED.

The wavelength converting layer 1050 may be in the path of light emitted by active region 1021, such that the light emitted by active region 1021 may traverse through one or more intermediate layers (e.g., a photonic layer). According to embodiments, wavelength converting layer 1050 or may not be present in LED array 1000. The wavelength converting layer 1050 may include any luminescent material, such as, for example, phosphor particles in a transparent or translucent binder or matrix, or a ceramic phosphor element, which absorbs light of one wavelength and emits light of a different wavelength. The thickness of a wavelength converting layer 1050 may be determined based on the material used or application/wavelength for which the LED array 1000 or individual pixels 1010, 1020, and 1030 is/are arranged. For example, a wavelength converting layer 1050 may be approximately 20 µm, 50 µm or 200 µm. The wavelength converting layer 1050 may be provided on each individual pixel, as shown, or may be placed over an entire LED array 1000.

Primary optic 1022 may be on or over one or more pixels 1010, 1020, and/or 1030 and may allow light to pass from the active region 1021 and/or the wavelength converting layer 1050 through the primary optic. Light via the primary optic may generally be emitted based on a Lambertian distribution pattern such that the luminous intensity of the light emitted via the primary optic 1022, when observed from an ideal diffuse radiator, is directly proportional to the cosine of the angle between the direction of the incident light and the surface normal. It will be understood that one or more properties of the primary optic 1022 may be modified to produce a light distribution pattern that is different than the Lambertian distribution pattern.

Secondary optics which include one or both of the lens 1064 and waveguide 1062 may be provided with pixels 1010, 1020, and/or 1030. It will be understood that although secondary optics are discussed in accordance with the example shown in FIG. 1B with multiple pixels, secondary optics may be provided for single pixels. Secondary optics may be used to spread the incoming light (diverging optics), or to gather incoming light into a collimated beam (collimating optics). The waveguide 1062 may be coated with a dielectric material, a metallization layer, or the like and may be provided to reflect or redirect incident light. In alternative embodiments, a lighting system may not include one or more of the following: the wavelength converting layer 1050, the primary optics 1022, the waveguide 1062 and the lens 1064.

Lens 1064 may be formed form any applicable transparent material such as, but not limited to SiC, aluminum oxide, diamond, or the like or a combination thereof. Lens 1065 may be used to modify the a beam of light to be input into the lens 1064 such that an output beam from the lens 1064 will efficiently meet a desired photometric specification. Additionally, lens 1064 may serve one or more aesthetic purpose, such as by determining a lit and/or unlit appearance of the multiple LED devices 200B.

FIG. 1C shows a cross section of a three dimensional view of a LED array 1100. As shown, pixels in the LED array 1100 may be separated by trenches which are filled to form n-contacts 1140. The pixels may be grown on a substrate 1114 and may include a p-contact 1113, a p-GaN semiconductor layer 1112, an active region 1111, and an n-GaN semiconductor layer 1110. It will be understood that this structure is provided as an example only and one or more semiconductor or other applicable layers may be added, removed, or partially added or removed to implement the disclosure provided herein. A converter material 1117 may be deposited on the semiconductor layer 1110 (or other applicable layer).

Passivation layers 1115 may be formed within the trenches 1130 and n-contacts 1140 (e.g., copper contacts) may be deposited within the trenches 1130, as shown. The passivation layers 1115 may separate at least a portion of the n-contacts 1140 from one or more layers of the semiconductor. According to an implementation, the n-contacts 1140, or other applicable material, within the trenches may extend into the converter material 1117 such that the n-contacts 1140, or other applicable material, provide complete or partial optical isolation between the pixels.

Figure 1D:
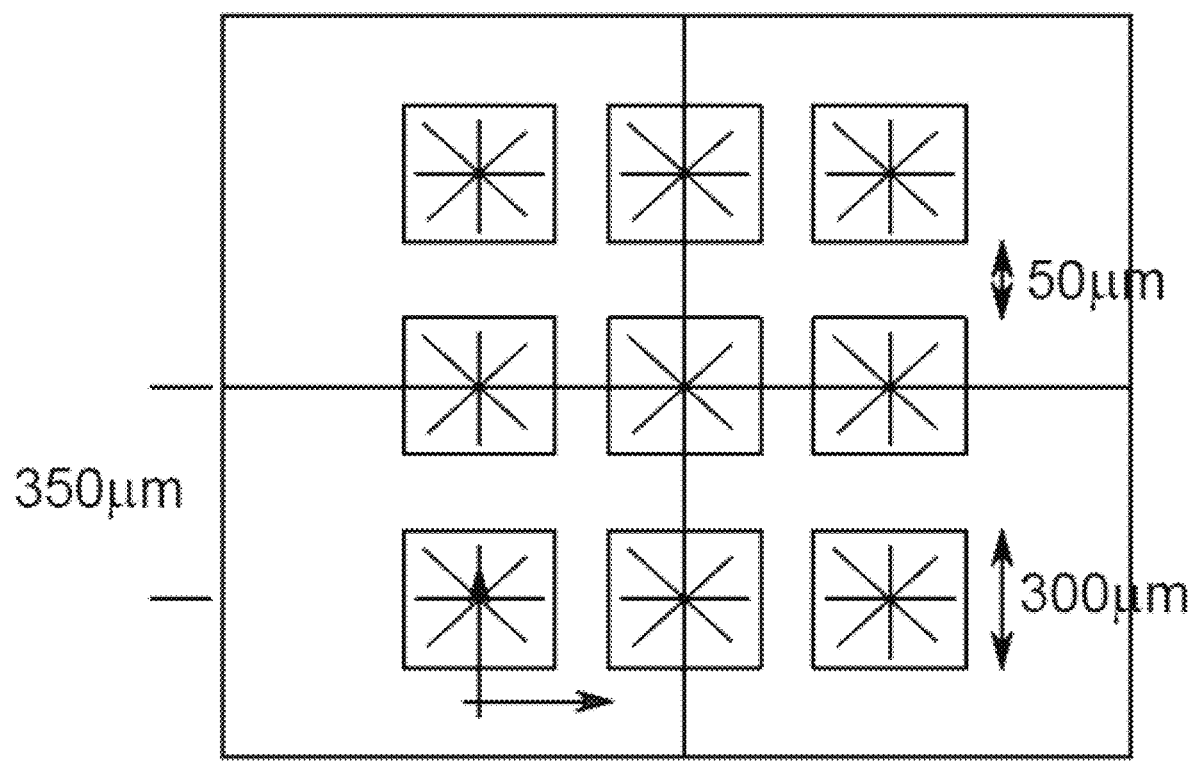
FIG. 1D illustrates an example LED with a matrix of emitters that are 1 square mm (not drawn to scale) with reference to FIG. 1A.

FIG. 1D illustrates an example LED with a matrix of emitters that are 1 square mm (not drawn to scale) with reference to FIG. 1A. In FIG. 1D there is illustrated a 3×3 matrix of emitters within the 1 square mm. Each emitter is approximately 300 microns with a 50 micron space between emitters. The center of emitter to center of emitter spacing is approximately 350 microns.

Figure 1E:
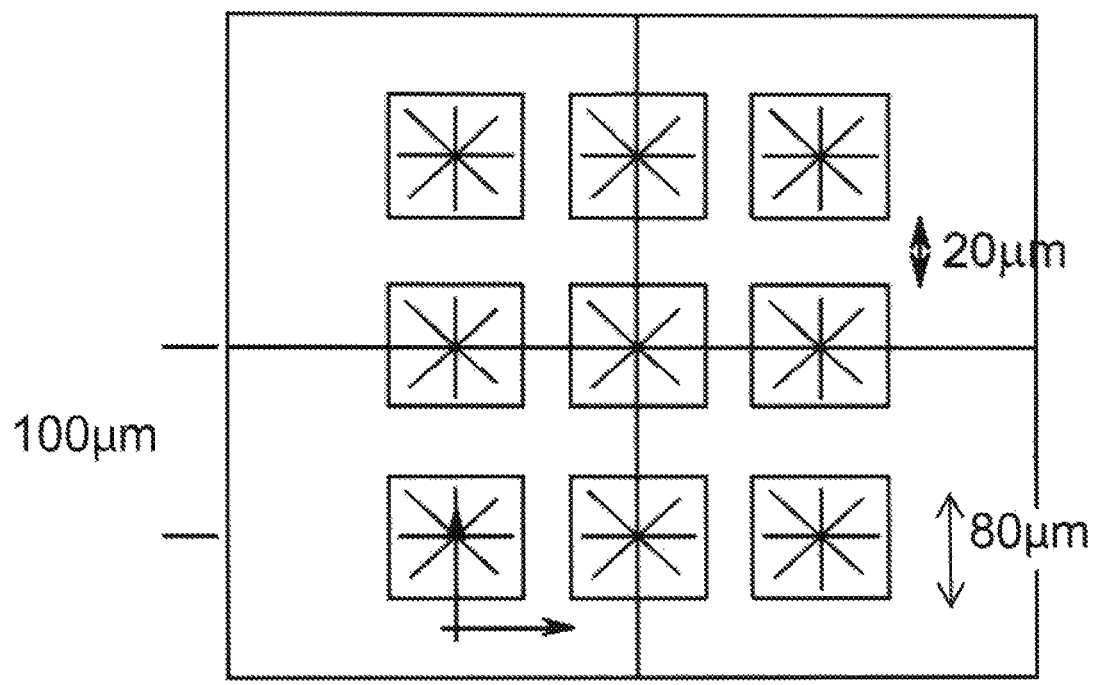
FIG. 1E illustrates an example LEDs with a matrix of emitters that are 1 square mm (not drawn to scale) with reference to FIG. 1A.

FIG. 1E illustrates an example LEDs with a matrix of emitters that are 1 square mm (not drawn to scale) with reference to FIG. 1A. In FIG. 1E there is illustrated a 10×10 matrix of emitters (only a portion of the matrix is represented) within the 1 square mm. Each emitter is approximately 80 microns with a 20 micron space between emitters. The center of emitter to center of emitter spacing is approximately 100 microns.

As the emitters have decreased in size to under 500 microns and to the sizes depicted in FIGS. 1A, 1D, 1E or even other configurations that are sub-300 microns and sub-100 microns, or even down to tens of microns, for example, and the spacing between emitters has continued to decrease, the coating phosphor sidewalls with absorbers, distributed Bragg reflectors (DBR), or other optical isolating material used in prior solutions fail to provide the necessary isolation.

Figure 1F:
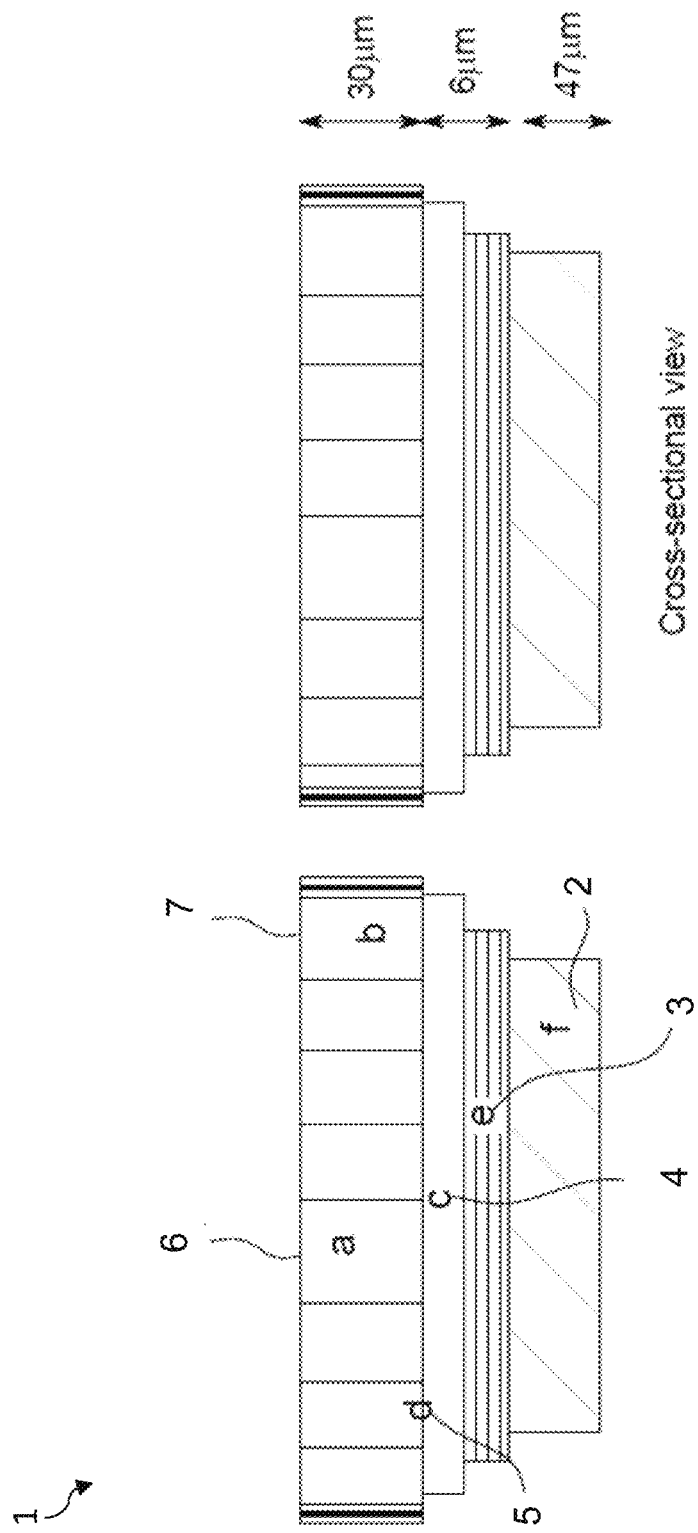
FIG. 1F illustrates, in cross section, an individual emitter from the arrays of FIGS. 1A, 1D, 1E.

FIG. 1F illustrates, in cross section, an individual emitter 1 from the arrays of FIGS. 1A, 1D, 1E. The emitter 1 includes a solder layer 2 supporting the active region 3 and the substrate 4. Adjacent to the substrate 4 and distal to the active region 3 is a pattern layer 5.

Solder layer 2 may be formed from AuSn or other metal material and generally provides a metal contact to a board, such as a printed circuit board (PCB). As illustrated, the solder layer 2 may be approximately 50 microns (47 microns as shown) thick.

The active region 3, or semiconductor layer, may take the form of a layer of pGaN. This active region 3 is the emitter active region. As would be understood by those possessing an ordinary skill the pertinent arts, GaN is a binary IIIN direct bandgap semiconductor commonly used in light-emitting diodes. GaN has a crystal structure with a wide band gap of 3.4 eV that makes the material ideal for applications in optoelectronics, high-power and high-frequency devices. GaN can be doped with silicon (Si) or with oxygen to create an n-type GaN and with magnesium (Mg) to create a p-type GaN as is used in the present example. The substrate 4 may be formed from GaN. The substrate 4 and active region 3 may be approximately 6 microns combined with the substrate 4 being approximately 5 microns and the active region 3 approximately 1 micron.

Pattern layer 5 may take the form of a patterned sapphire substrate (PSS) layer. Pattern layers 5 may provide periodic structures of varying geometry and dimension on the sapphire substrate surface. These sapphire wafers with periodic structures of various shapes such as cone, dome, pyramid, and pillar, etc., are called PSS. PSS refers to the patterned sapphire substrate where the GaN is grown on a sapphire substrate with a pattern to enhance extraction. In the configuration illustrated, the sapphire has been removed leaving the pattern 5 registered on the GaN 4 surface.

Adjacent to the pattern layer 5 and distal to the substrate 4 is a patterned phosphor layer 6. This patterned phosphor layer 6 is approximately 30 microns thick. Sapphire is not present in this structure, with the patterned phosphor layer 6 directly being mounted on the substrate 4. The patterned phosphor layer 6 may include a DBR 7. Optical isolation may be provided in part by vertically extending light barrier elements positioned to vertically extend throughout the patterned phosphor layer 6, as well as a DBR 7 separately attached to or within the patterned phosphor layer 6 and the substrate 4. Other embodiments may include various combinations of DBR, absorbers, and metallization within the vertically extending light barrier elements to improve optical isolation between emitters.

Figure 1G:
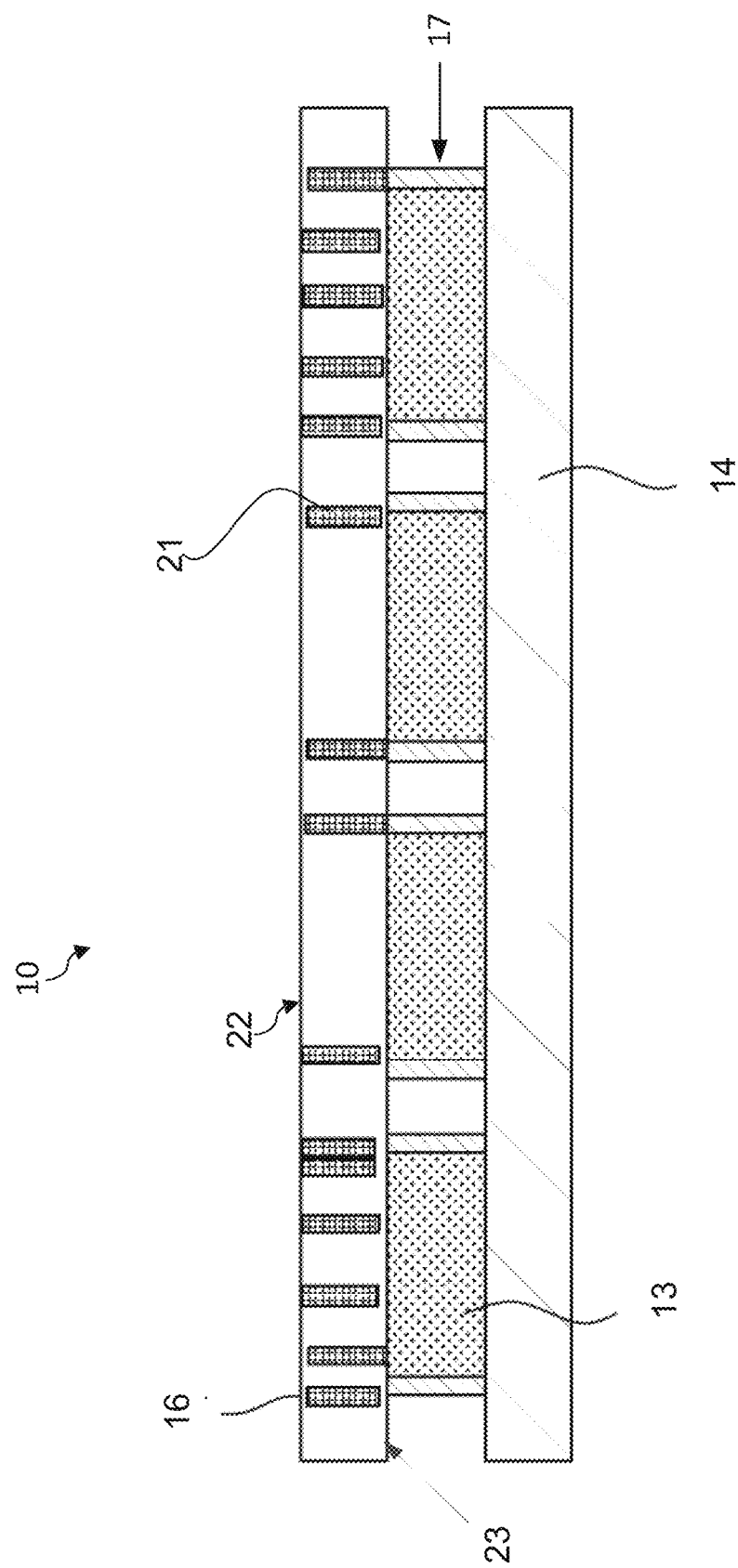
FIG. 1G illustrates, in cross section, another embodiment of an individual emitter from the arrays of FIGS. 1A, 1D, 1E.

In order to achieve optical isolation, the patterned phosphor region 16, or layer, of FIGS. 1F and 1G may take the form of a ceramic phosphor, such a Lumiramic, for example, that is formed to have internal light barriers 21 that vertically extend between the GaN attachment surface 23 and the phosphor emission surface 22. The light barriers 21 may be compositionally distinct material, thin films, or metallic reflectors. The Lumiramic may be used for the pattern phosphor layer 6 in FIG. 1F. The light barriers 21 may be formed in segmented phosphors arranged on top each GaN mesa, or in continuous phosphor layers that extend over multiple GaN mesas.

Alternatively, light barriers 21 may be formed by providing air gaps that define continuous, discontinuous or partial open channels, or etched pinholes through the phosphor. The channels or pinholes may be structured, partially structured, or randomly defined. Radial, linear, rectangular, square, hexagonal, or other suitably shaped walls or structures may be defined. High index and/or low index particles may be introduced. For example, a two or more layer films composed of a phosphor ceramic precursor and a light barrier/reflector/scatterer can be repeatedly folded, sliced, and fired to form a phosphor ceramic orientable to reduce lateral light propagation.

Light barriers 21 within the phosphor ceramic are aligned within an area of the phosphor overlaying a GaN emitter, light barriers 21 within the phosphor ceramic are aligned within the area of the phosphor overlaying a GaN emitter along the pixel perimeter, and/or light barriers 21 within the phosphor ceramic are aligned outside the area of the phosphor overlaying a GaN emitter by aligning with interpixel lanes (e.g., between GaN mesas). In other embodiments where a continuous phosphor ceramic layer extends across multiple GaN mesas, a sidewall DBR layer is applied to the GaN, followed by vertically extending light barrier 21 elements (in this case air gap scattering walls) in the continuous phosphor.

The vertically extending light barrier 21 elements may be created during manufacture of the phosphors (e.g., by repeated folding of a bilayer including the light barrier and a phosphor ceramic precursor), after creation of the ceramic, or after attachment to the GaN, as will be described below. The light barriers 21 may be created using laser drilling or water jet drilling.

Figure 1H:
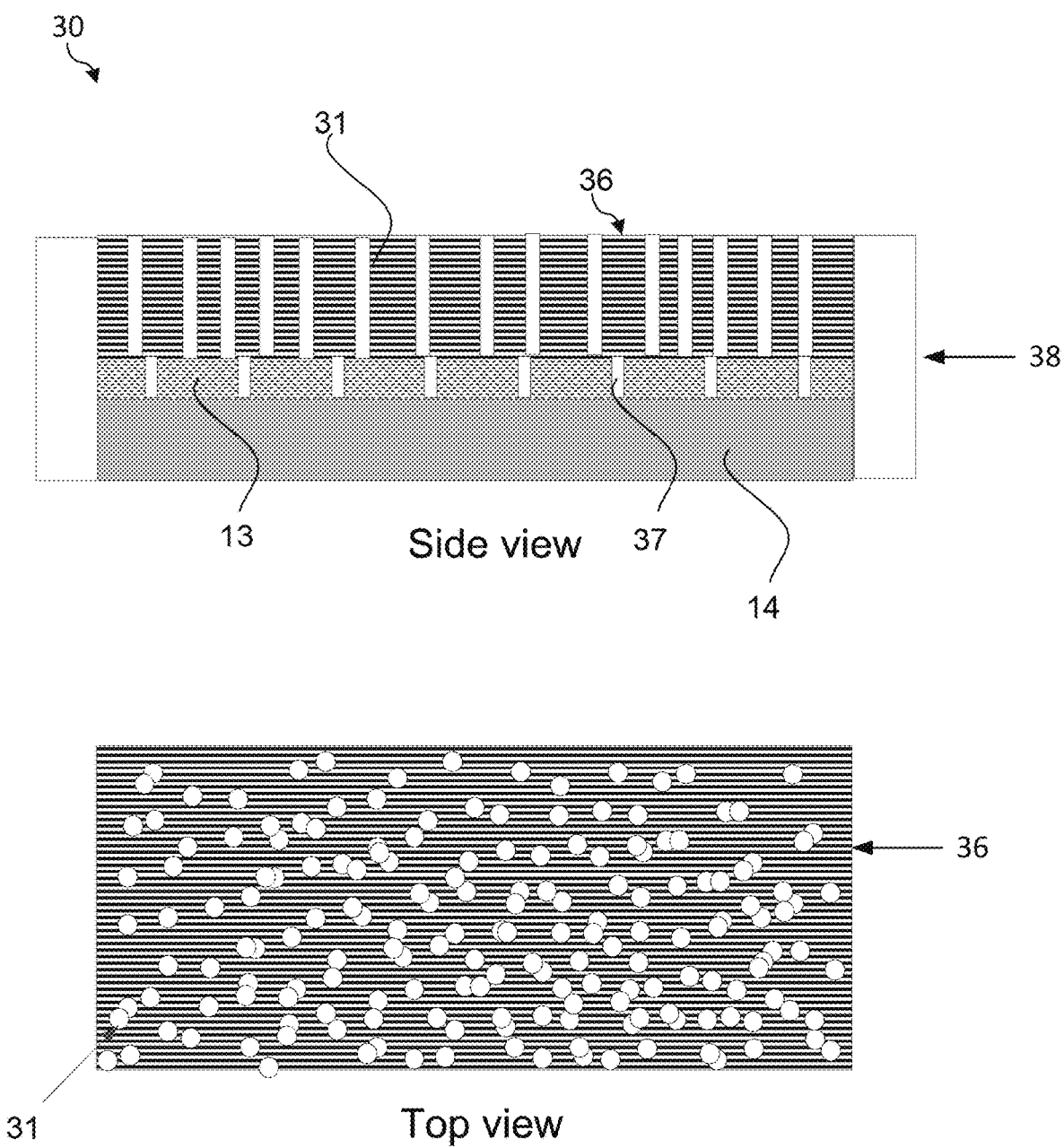
FIG. 1H illustrates a top view and side view of an example device of FIG. 1G.

FIG. 1H illustrates a top view and side view of an example device 30 of FIG. 1G. Device 30 includes has an emitter 13 and includes a substrate 14. The substrate 14 may be a silicon or ceramic substrate, for example. Adjacent to this substrate 14 is the emitter region 13 (shown with four emitters in FIG. 1G) with each emitter region 13 surrounded by a sidecoating 38 with metal, dielectric, or diffuse reflector. The emitter 13 may be a GaN semiconductor emitter, for example. Adjacent to the emitter 13 and distal to the substrate 14 is a patterned phosphor region 36. The metal coating 37 around GaN pixels is shown delineating the pixels. The phosphor region 36 includes a number of vertical light barriers 31 that take the form of holes. Layer 36 may be arranged with a random arrangement of holes 31 such as by etching. Such holes 31 may be cylindrical and run vertically through the layer 36. The holes 31 may be spheroidal in shape and may be embedded in the layer 36. The hole 31 diameters may vary from 50 to 400 nm and inter-hole spacing may be varied in the range 0 to 300 nm. In addition to holes 31 with circular cross-section, holes (not shown) with rectangular cross-section may be used. An array of pyramidal holes (not shown) extending deep into the layer may be also used. The air holes 31 may be back-filled with metal scattering elements and dielectrics to enhance the reflected/absorbed light. As is illustrated in the top view of FIG. 1H, the holes 31 are randomly spaced throughout layer 36.

Figure 1I:
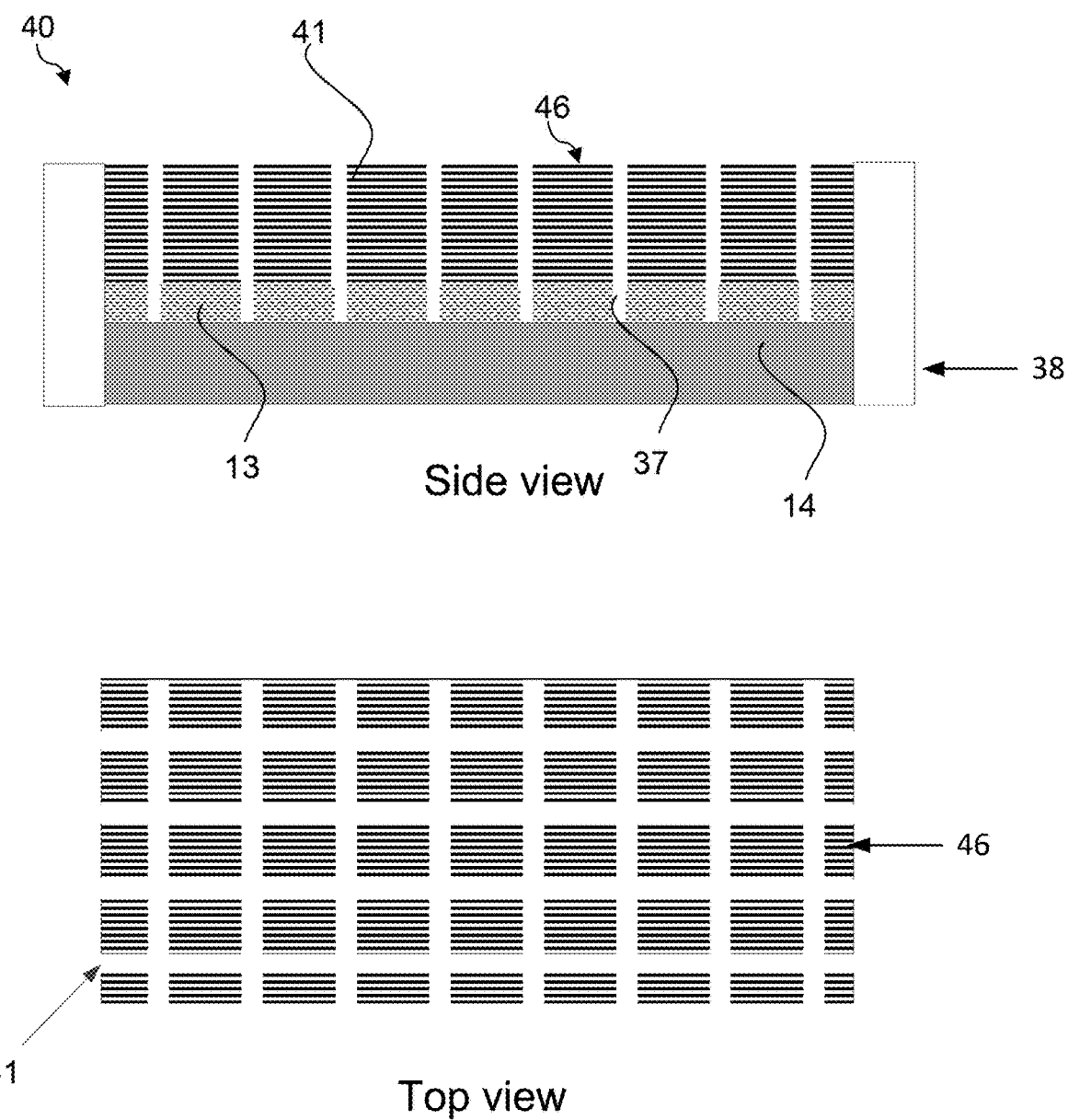
FIG. 1I illustrates a top view and side view of an example device of FIG. 1G.

FIG. 1I illustrates a top view and side view of an example device 40 of FIG. 1G. Device 40 includes an emitter 13 and includes a substrate 14. The substrate 14 may be a silicon or ceramic substrate, for example. Adjacent to this substrate 14 is the emitter region 13 (shown with four emitters in FIG. 1G) with each emitter region 13 surrounded by a sidecoating 38 with metal, dielectric, or diffuse reflector. The emitter 13 may be a GaN semiconductor emitter, for example. Adjacent to the emitter 13 and distal to the substrate 14 is a patterned phosphor region 46. The metal coating 37 around GaN pixels is shown delineating the pixels. The phosphor region 46 includes a number of vertical light barriers 41. Vertical light barriers 41 may define pixel edges (the center two pixels), while others provide vertical light barriers 41 formed in the phosphor layer 46 over each pixel (the edge pixels). Illustrated in FIG. 1I there are vertical barriers 41 aligned with the pixel edges of the metal coating 37. This allows for wave-guiding in the z-direction while not wave-guiding in the x-y plane of the phosphor converter providing an increase in the pixel-isolation between neighbors. Ordered structures, such as photonic crystals and metamaterials, may be used. Photonic crystals may provide rectangular, triangular and hexagonal patterns of vertical holes with at least 3 layers of unit cells. Each unit cell may have a diameter of the hole varying from 100-400 nm with unit cell size varying from 300 to 600 nm. As is illustrated in the top view of FIG. 1I, the vertical barriers 41 provide a grid pattern in phosphor region 36.

Figure 1J:
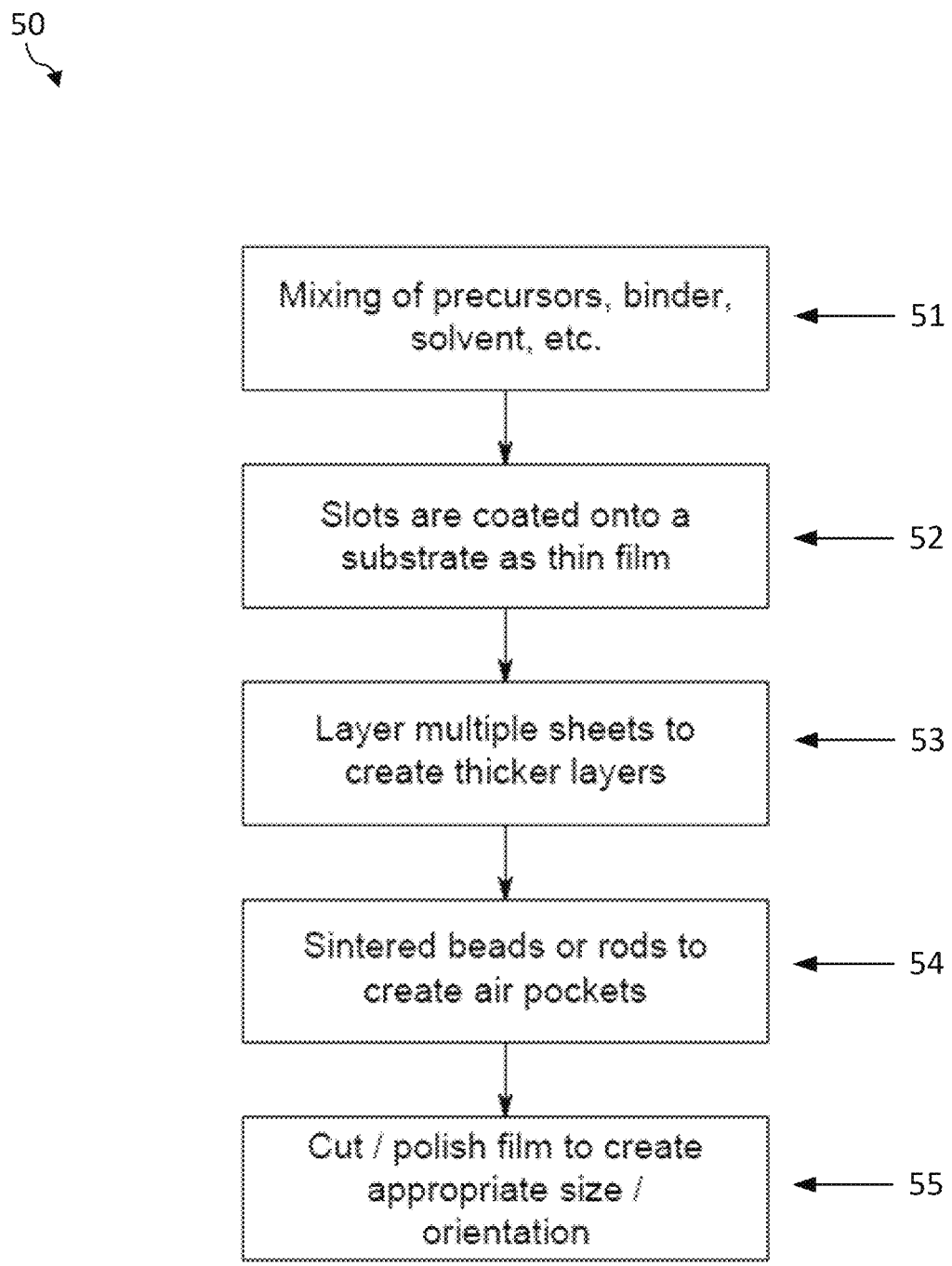
FIG. 1J illustrates a method of making ceramic phosphor layers with lateral light barriers.

FIG. 1J illustrates a method 50 of making ceramic phosphor layers with lateral light barriers. The method 50 to make such layers includes mixing of the ceramic powder precursors, the ceramic binder, solvent and addition of polymeric beads or rods, such as PMMA, at step 51. Method 50 also includes slot die coating the mixture onto a substrate to form a thin film at step 52. Method 50 also includes layering multiple sheets to from thicker layers appropriate for the phosphor ceramic at step 53. After initial baking of solvents, method 50 includes sintering the polymer beads or rods to create air pockets at step 54. The patterning and alignment of these beads or rods can help prepare the appropriate optical scattering in the ceramic phosphor films. Method 50 also includes completing the phosphor film by cutting and/or polishing to create the appropriately sized platelet and orientation for LED use at step 55.

Figure 1K:
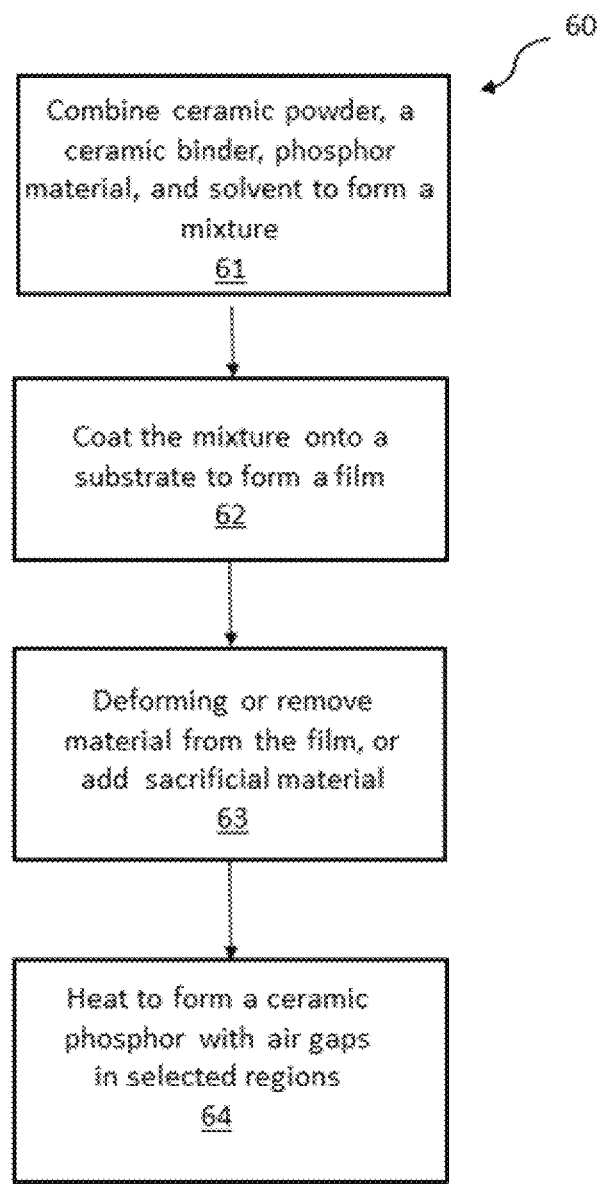
FIG. 1K illustrates a general method of making ceramic phosphor layers with air gaps.

FIG. 1K illustrates a general method 60 of making ceramic phosphor layers with air gaps. The method includes making a ceramic phosphor layer by combining ceramic powder precursors, a ceramic binder, phosphor material, and solvent to form a mixture (step 61). The mixture is coated onto a substrate to form a film (step 62). Conditions for creating air gap formation in selected regions of coated mixture are arranged by at least one of deforming or removing material from the film, or adding at least one of sacrificial material, sintering rods, and beads to the film (step 63). The film can be heated to form a ceramic phosphor with air gaps in selected regions (step 64).

FIGS. 1J and 1K respectively illustrate the steps of a method 50 and 60 for forming ceramic phosphor layers with lateral light barriers. One of ordinary skill in the art would understand that more or less steps can be involved. Additionally, any of the steps may be combined to be performed at the same time. The order of these steps can also be altered such that any one or more of the steps are performed in a different sequence than illustrated in FIGS. 1J and 1K.

The devices described in FIGS. 1A-K may be used in the devices and with the electronics described as follows. For example, the devices in FIGS. 1A-K may be LED array 410 described below.

Figure 2A:
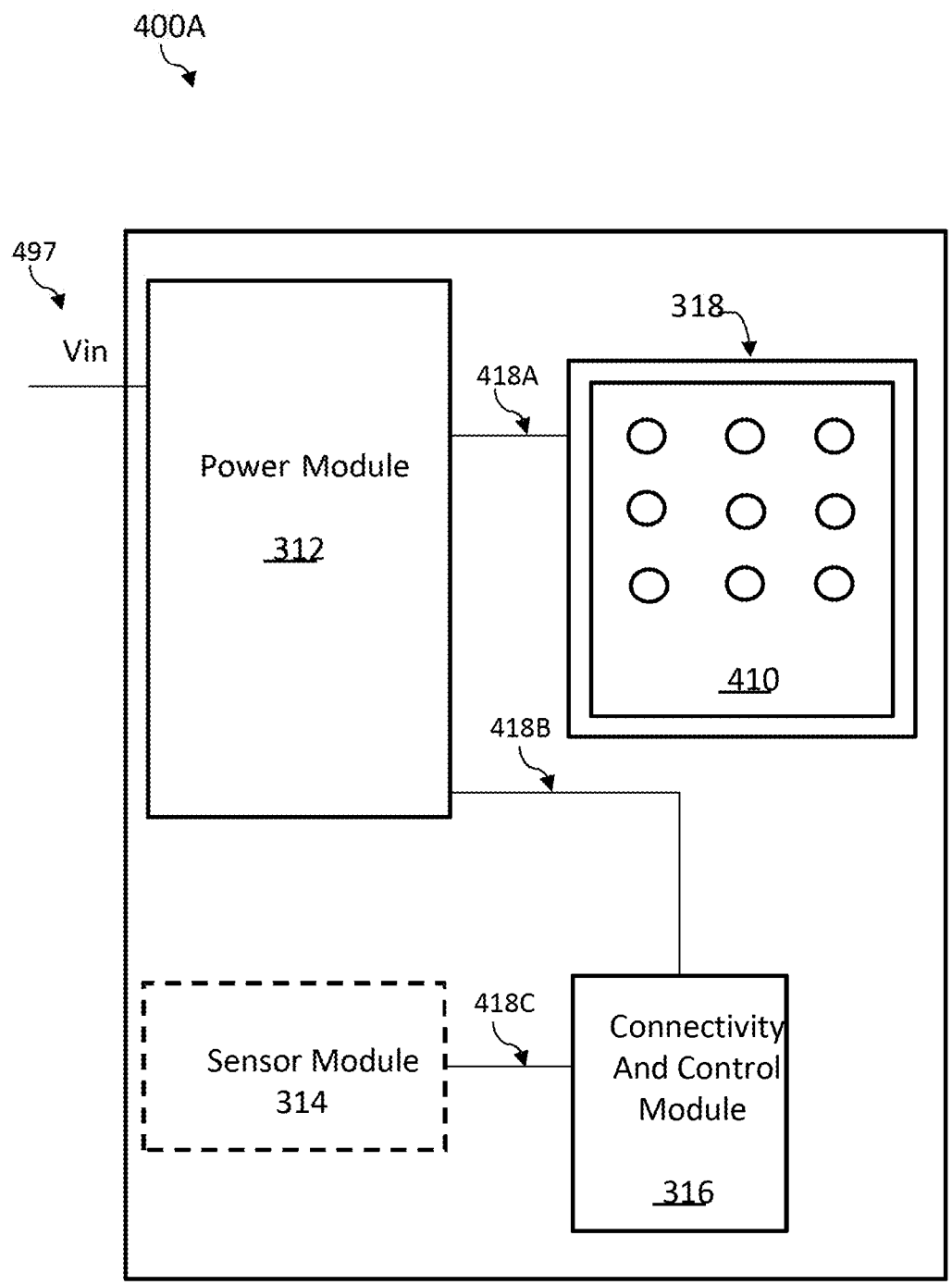
FIG. 2A is a top view of the electronics board with LED array attached to the substrate at the LED device attach region in one embodiment.

FIG. 2A is a top view of an electronics board with an LED array 410 attached to a substrate at the LED device attach region 318 in one embodiment. The electronics board together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 2A, the connectivity and control module 316 receives sensor signals from the sensor module 314 over trace 418C.

Figure 2B:
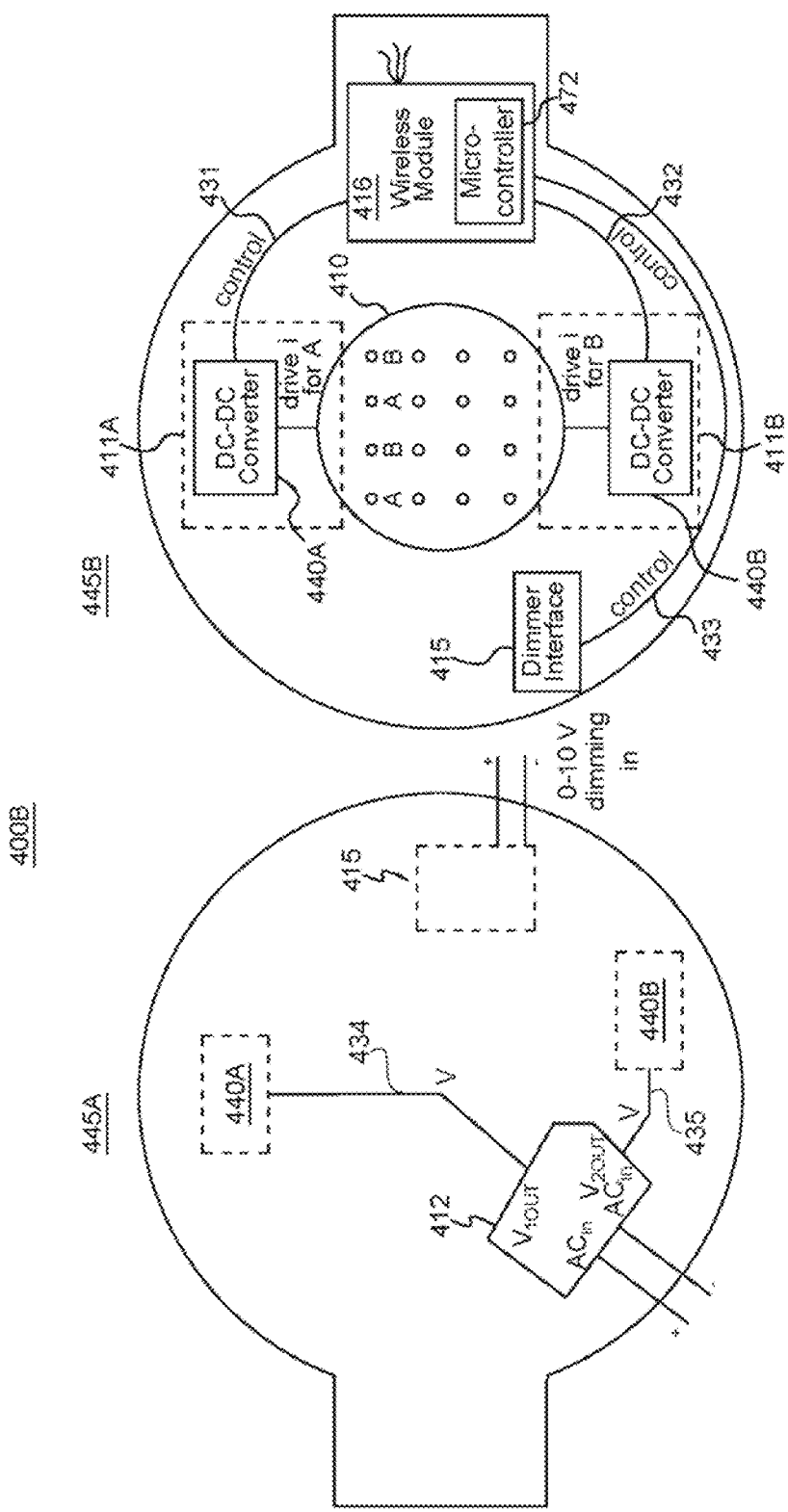
FIG. 2B is a diagram of one embodiment of a two channel integrated LED lighting system with electronic components mounted on two surfaces of a circuit board.

FIG. 2B illustrates one embodiment of a two channel integrated LED lighting system with electronic components mounted on two surfaces of a circuit board 499. As shown in FIG. 2B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it. The LED array 410 is driven by two independent channels 411A and 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 411B, respectively. Although the embodiment shown in FIG. 2B does not include a sensor module (as described in FIG. 2A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 2C:
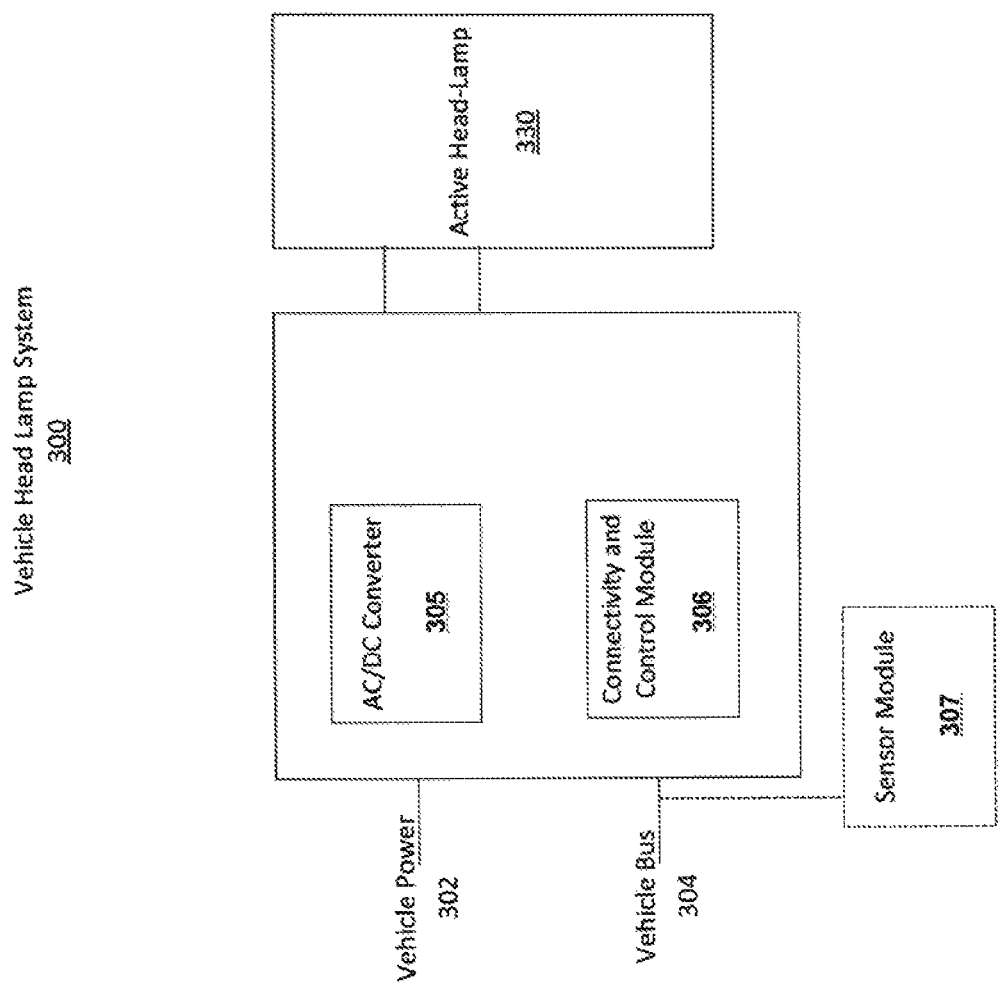
FIG. 2C is an example vehicle headlamp system.

FIG. 2C shows an example vehicle headlamp system 300 including a vehicle power 302 including a data bus 304. A sensor module 307 may be connected to the data bus 304 to provide data related to environment conditions (e.g. ambient light conditions, temperature, time, rain, fog, etc), vehicle condition (parked, in-motion, speed, direction), presence/position of other vehicles, pedestrians, objects, or the like. The sensor module 307 may be similar to or the same as the sensor module 314 of FIG. 2A. AC/DC Converter 305 may be connected to the vehicle power 302.

The AC/DC converter 305 of FIG. 2C may be the same as or similar to the AC/DC converter 412 of FIG. 2B and may receive AC power from the vehicle power 302. It may convert the AC power to DC power as described in FIG. 2B for AC-DC converter 412. The vehicle head lamp system 300 may include an active head lamp 330 which receives one or more inputs provided by or based on the AC/DC converter 305, connectivity and control module 306, and/or sensor module 307. As an example, the sensor module 307 may detect the presence of a pedestrian such that the pedestrian is not well lit, which may reduce the likelihood that a driver sees the pedestrian. Based on such sensor input, the connectivity and control module 306 may output data to the active head lamp 330 using power provided from the AC/DC converter 305 such that the output data activates a subset of LEDs in an LED array contained within active head lamp 330. The subset of LEDs in the LED array, when activated, may emit light in the direction where the sensor module 307 sensed the presence of the pedestrian. These subset of LEDs may be deactivated or their light beam direction may otherwise be modified after the sensor module 307 provides updated data confirming that the pedestrian is no longer in a path of the vehicle that includes vehicle head lamp system.

Figure 3:
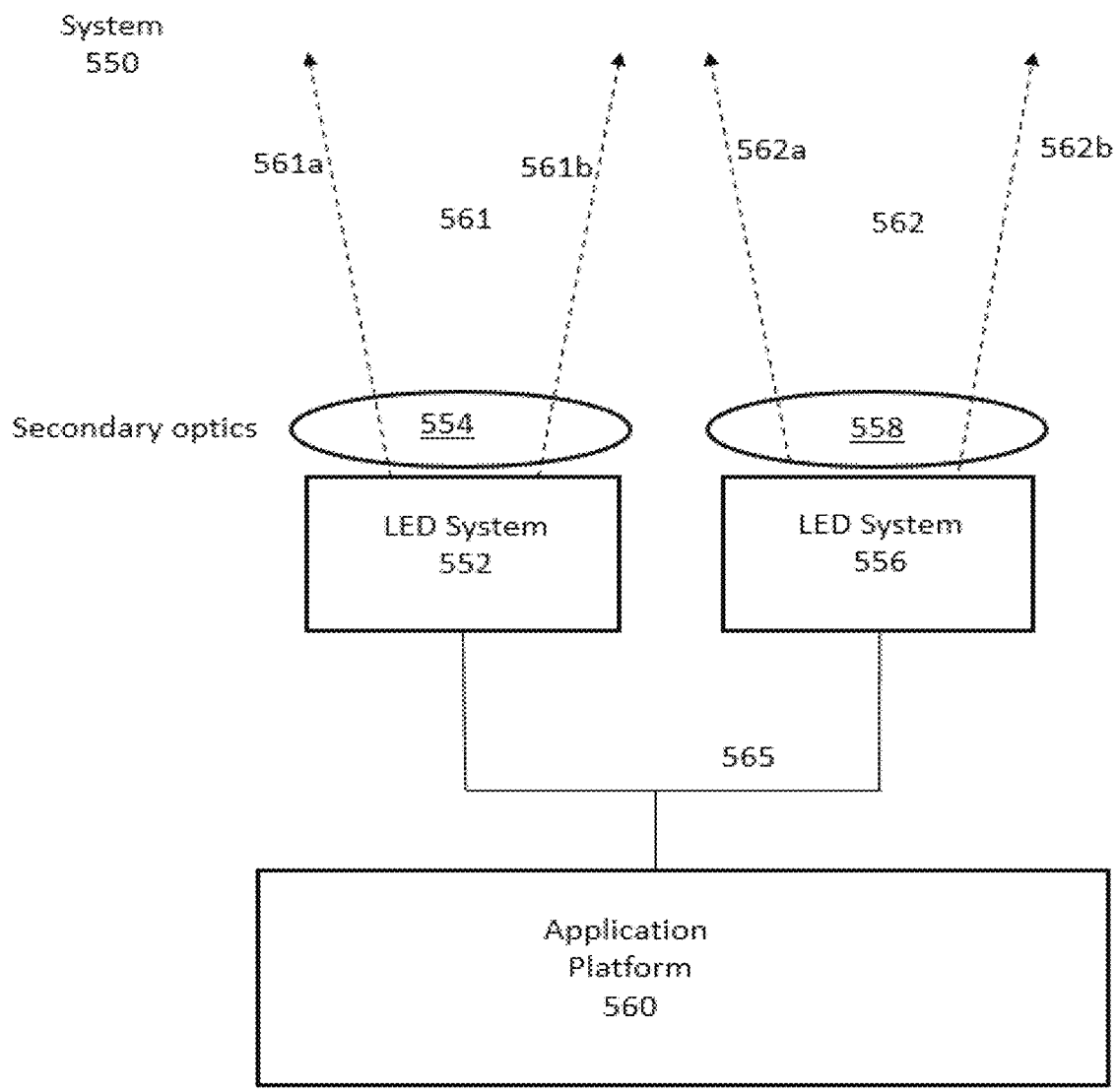
FIG. 3 shows an example illumination system.

FIG. 3 shows an example system 550 which includes an application platform 560, LED systems 552 and 556, and optics 554 and 558. The LED System 552 produces light beams 561 shown between arrows 561a and 561b. The LED System 556 may produce light beams 562 between arrows 562a and 562b. In the embodiment shown in FIG. 3, the light emitted from LED System 552 passes through secondary optics 554, and the light emitted from the LED System 556 passes through secondary optics 558. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The LED System 400A shown in FIG. 2A and vehicle head lamp system 300 shown in FIG. 2C illustrate LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560. Alternatively or in addition, as shown in the LED system 400 of FIG. 2A, each LED System 552 and 556 may include its own sensor module, connectivity and control module, power module, and/or LED devices.

In embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an advanced driver-assistance systems/autonomous vehicle (ADAS/AV) based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In an example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors (e.g., similar to sensors module 314 of FIG. 2A and 307 of FIG. 2C) that identify portions of a scene (roadway, pedestrian crossing, etc.) that require illumination.

Light emitting arrays or microLED arrays such as disclosed herein may support a wide range of applications that benefit from fine-grained intensity, spatial, and temporal control of light distribution. This may include, but is not limited to, precise spatial patterning of emitted light from blocks or individual LEDs. Depending on the application, emitted light may be spectrally distinct, adaptive over time, and/or environmentally responsive. In some embodiments, the light emitting arrays may provide pre-programmed light distribution in various intensity, spatial, or temporal patterns. The emitted light may be based at least in part on received sensor data and may be used for optical wireless communications. Associated optics may be distinct at single or multiple LED level. An example light emitting array may include a device having a commonly controlled central block of high intensity LEDS with an associated common optic, whereas edge positioned LEDs may have individual optics. Common applications supported by light emitting LED arrays include video lighting, automotive headlights, architectural and area illumination, street lighting, and informational displays.

Programmable light emitting arrays may be used to selectively and adaptively illuminate buildings or areas for improved visual display or to reduce lighting costs. In addition, light emitting arrays may be used to project media facades for decorative motion or video effects. In conjunction with tracking sensors and/or cameras, selective illumination of areas around pedestrians may be possible. Spectrally distinct LEDs may be used to adjust the color temperature of lighting, as well as support wavelength specific horticultural illumination.

Street lighting is an important application that may greatly benefit from use of programmable light emitting arrays. A single type of light emitting array may be used to mimic various street light types, allowing, for example, switching between a Type I linear street light and a Type IV semicircular street light by appropriate activation or deactivation of selected LEDs. In addition, street lighting costs may be lowered by adjusting light beam intensity or distribution according to environmental conditions or time of use. For example, light intensity and area of distribution may be reduced when pedestrians are not present. If LEDs of the light emitting array are spectrally distinct, the color temperature of the light may be adjusted according to respective daylight, twilight, or night conditions.

Programmable light emitting LEDs are also well suited for supporting applications requiring direct or projected displays. For example, automotive headlights requiring calibration, or warning, emergency, or informational signs may all be displayed or projected using light emitting arrays. This allows, for example, modifying directionality of light output from an automotive headlight. If a light emitting array is composed of a large number of LEDs or includes a suitable dynamic light mask, textual or numerical information may be presented with user guided placement. Directional arrows or similar indicators may also be provided.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

The invention claimed is:

1. A light emitting device comprising:
   (a) a continuous phosphor layer having a top surface, a bottom surface oppositely positioned from the top surface, and side surfaces connecting the top and bottom surfaces, the continuous phosphor layer including phosphor material and one or more of a ceramic, a glass, or an organic binder;
   (b) a plurality of air gaps that form light barriers arranged within the continuous phosphor layer so as to at least partially block transmission of light toward at least one of the side surfaces, one or more of the light barriers extending entirely through the continuous phosphor layer from the top surface to the bottom surface; and
   (c) one or more light emitting diodes (LEDs) positioned on the bottom surface of the continuous phosphor layer and arranged so as to emit light into the phosphor structure,
   (d) the one or more LEDs including a plurality of LEDs forming an array of pixels with each pixel separated from other pixels by one or more interpixel lanes, and each one of the light barriers being positioned over a corresponding interpixel lane.

2. The light emitting device of claim 1 wherein one or more of the light barriers extends only partly through the continuous phosphor layer.

3. The light emitting device of claim 1 wherein the continuous phosphor layer is arranged as layered thin films.

4. The light emitting device of claim 1 wherein the air gaps include holes through or pockets within the continuous phosphor layer.

5. The light emitting device of claim 1 wherein one or more of the air gaps contain metallic or dielectric scattering elements.

6. The light emitting device of claim 1 wherein the air gaps are arranged along the continuous phosphor layer randomly or irregularly.

7. The light emitting device of claim 1 wherein the air gaps are arranged along the continuous phosphor layer in a regular pattern.

8. The light emitting device of claim 1 wherein the air gaps are less than about 400 nm across.

9. The light emitting device of claim 1 wherein each air gap is within about 300 nm of another air gap.

10. The light emitting device of claim 1 wherein pixels of the array are less than about 300 microns wide, and interpixel lanes are less than about 50 microns wide.

11. The light emitting device of claim 1 wherein pixels of the array are less than about 100 microns wide, and inter-pixel lanes are less than about 20 microns wide.

12. The light emitting device of claim 1 wherein each of the one or more LEDs includes an emitter and distributed Bragg reflectors (DBRs) that are arranged on sidewalls of the emitter and do not extend into the continuous phosphor layer.

13. A method for making the light emitting device of claim 1, the method comprising positioning the one or more light emitting diodes (LEDs) on the bottom surface of the continuous phosphor layer.

14. The method of claim 13, further comprising:
(A) combining ceramic powder precursors, a ceramic binder, phosphor material, and solvent to form a mixture;
(B) coating the mixture of part (A) onto a substrate to form a film, either as (i) a single-layer film or (ii) a multi-layer film comprising multiple slot-die-coated thin films;
(C) creating conditions for forming the light barriers within selected regions of the film of part (B) by one or more of (i) deforming or removing material from the film, or (ii) adding to the mixture or to the film one or more of sacrificial material, sintering rods or beads, or polymeric rods or beads; and
(D) after part (C), heating or sintering the film to form the continuous phosphor layer and the plurality of light barriers within the continuous phosphor layer.

* * * * *

UNITED STATES PATENT AND TRADEMARK OFFICE
CERTIFICATE OF CORRECTION

| | | |
|---|---|---|
| PATENT NO. | : 11,054,112 B2 | Page 1 of 1 |
| APPLICATION NO. | : 16/228586 | |
| DATED | : July 6, 2021 | |
| INVENTOR(S) | : Kentaro Shimizu, Venkata Ananth Tamma and Hisashi Masui | |

It is certified that error appears in the above-identified patent and that said Letters Patent is hereby corrected as shown below:

On the Title Page

Item (63) should read:
--Continuation-in-part of application No. 16/226,487, filed on Dec. 19, 2018--.

Signed and Sealed this
Ninth Day of September, 2025

Coke Morgan Stewart
*Acting Director of the United States Patent and Trademark Office*